(12) United States Patent
Rangarajan et al.

(10) Patent No.: US 7,565,482 B1
(45) Date of Patent: Jul. 21, 2009

(54) METHOD AND DEVICE FOR SCALABLE MULTIPLE MATCH EXTRACTION FROM SEARCH DATA

(75) Inventors: Anand Rangarajan, Santa Clara, CA (US); Srinivasan Venkatachary, Sunnyvale, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 385 days.

(21) Appl. No.: 11/638,649

(22) Filed: Dec. 13, 2006

Related U.S. Application Data

(60) Provisional application No. 60/749,862, filed on Dec. 13, 2005.

(51) Int. Cl.
*G06F 12/00* (2006.01)
(52) U.S. Cl. ...................................... 711/108
(58) Field of Classification Search ........................ None
See application file for complete search history.

(56) References Cited

U.S. PATENT DOCUMENTS

| | | | |
|---|---|---|---|
| 5,617,348 A * | 4/1997 | Maguire | 365/49.17 |
| 6,434,662 B1 | 8/2002 | Greene et al. | |
| 6,553,453 B1 * | 4/2003 | Gibson et al. | 711/108 |
| 6,631,419 B1 | 10/2003 | Greene | |
| 7,111,123 B1 | 9/2006 | Zou | |
| 2002/0078319 A1 * | 6/2002 | Chauvel et al. | 711/206 |

OTHER PUBLICATIONS

U.S. Appl. No. 10/866,353, Venkatachary, Srinivasan.

* cited by examiner

*Primary Examiner*—Hiep T Nguyen
(74) *Attorney, Agent, or Firm*—Haverstock & Owens, LLP

(57) ABSTRACT

A search engine system (100) compares search key values to stored entry values, and includes first blocks of entries (102) and second blocks of entries (104). First blocks of entries (102) can be "search" blocks that can provide a relatively fast search speed of stored data value, and each store a unique first portion of one or more entry values. Second blocks of entries (104) can be randomly accessible entries logically arranged into search nodes that each correspond to a first portion of an entry value stored in the first block of entries. Each search node can include one or more second portions of an entry value.

20 Claims, 12 Drawing Sheets

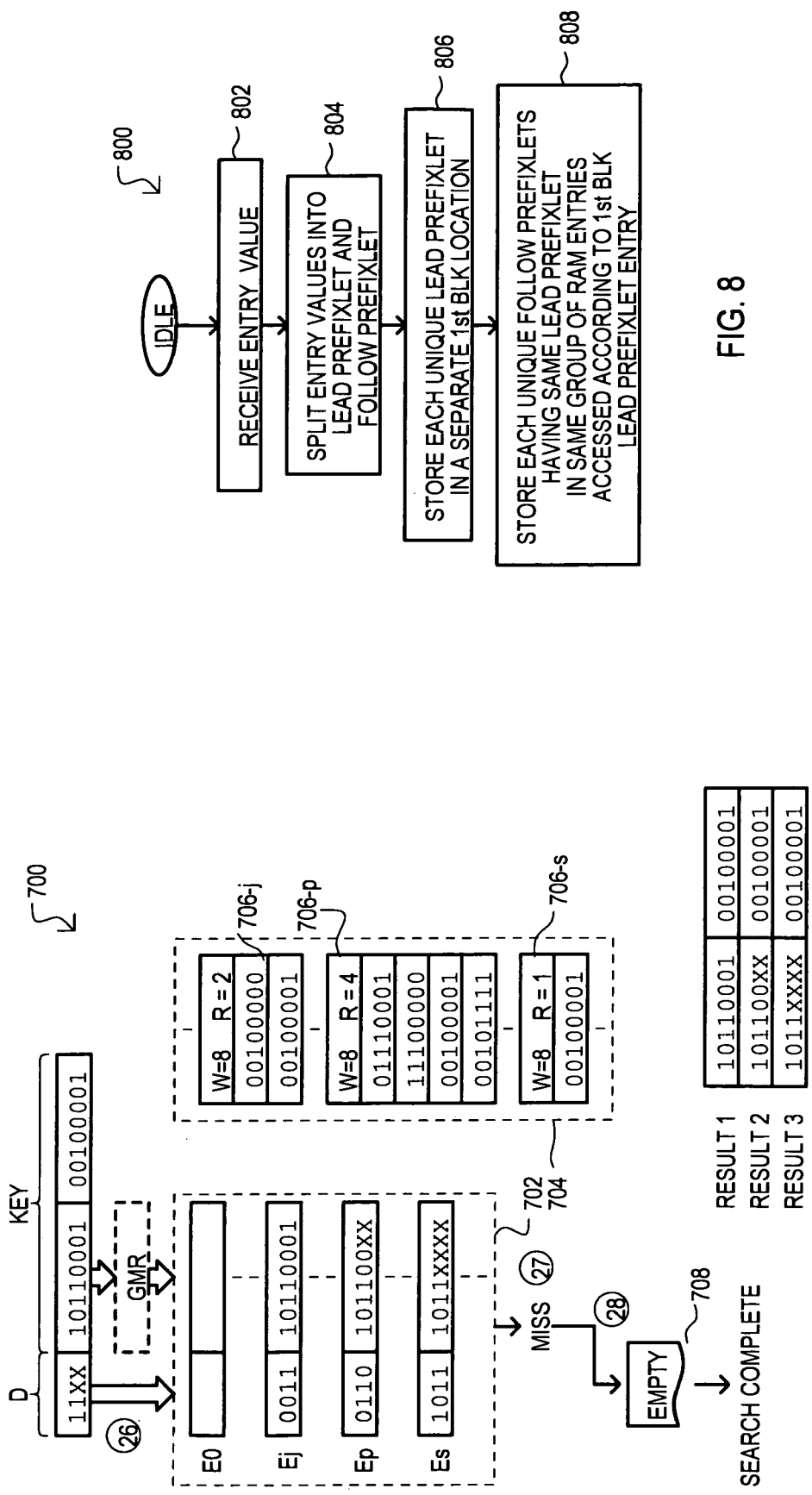

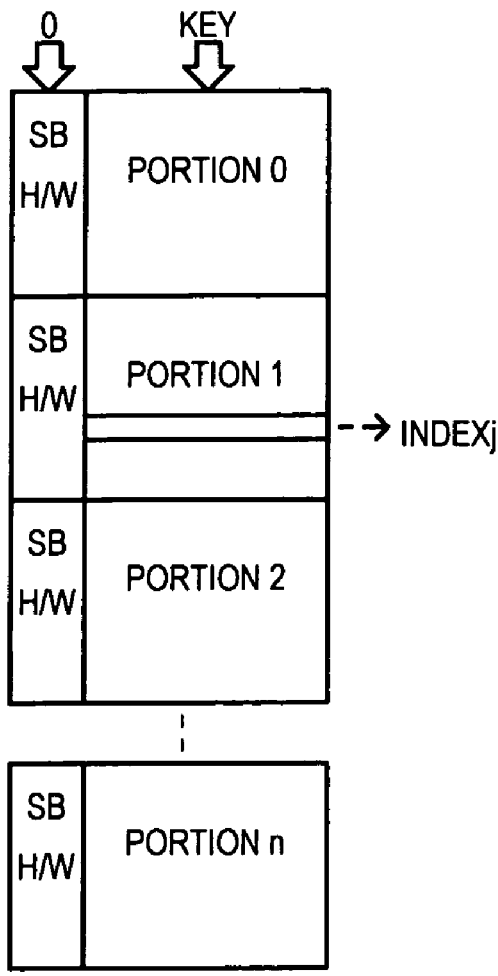 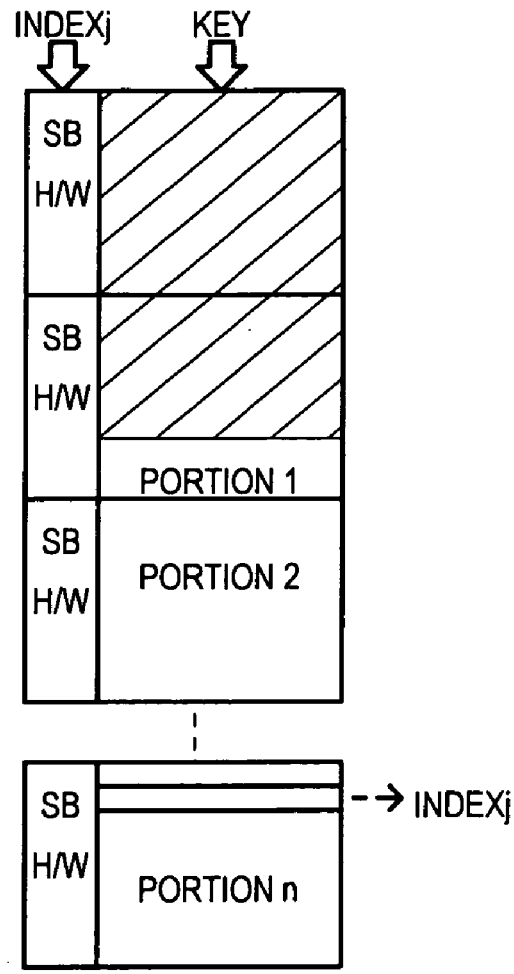
FIG. 13A
(BACKGROUND ART)
FIG. 13B
(BACKGROUND ART)

METHOD AND DEVICE FOR SCALABLE MULTIPLE MATCH EXTRACTION FROM SEARCH DATA

This application claims the benefit of U.S. Provisional Patent Application Ser. No. 60/749,862 filed on Dec. 13, 2005, the contents of which are incorporated by reference herein.

TECHNICAL FIELD

The present invention relates generally to search engine devices and systems, and more particularly to multiple match extraction from a search engine.

BACKGROUND OF THE INVENTION

Search engine systems and devices can provide rapid searching of data tables for applications such as network packet processing, or the like. Conventional search engine systems typically rely on one or two types of memory structures to execute search operations: content addressable memories (CAMs) or random access memories (RAMs). In the case of RAMs, a data table can be searched in a sequential fashion, comparing a search key to data stored in each RAM entry. While RAM components are substantially less expensive than CAM components, such sequential search operations can take considerable time to complete.

In contrast, in a conventional CAM, a given search key can be searched against a set of data value in a parallel fashion. In the case of a ternary CAM (TCAM), each entry can include bit locations that store 0, 1 or don't-care value (X) for comparison against corresponding bits of a search key. After a parallel search on the entries of a CAM, a highest priority match can be output as a search result. Conventionally, priority can be based on physical address, and a search result can be an address or index generated by a priority encoder circuit. The parallel search capability of TCAM devices allows for search speeds well beyond those of sequential RAM approaches. Unfortunately, CAM components are considerably more expensive than RAM components, and can consume relatively large amounts of power during operation.

While CAM devices can rapidly determine the highest priority matching entry value, for some applications, determination of a single matching value is not sufficient. Instead, it may be desirable to determine the first "k" matches (k>1) or "all existing matches" within a given data set.

To better understand various features of the disclosed embodiments, conventional search engine approaches will first be described.

A first conventional approach is shown in FIGS. 12A to 12C. FIGS. 12A to 12C show entry data for a CAM device. Each CAM entry includes a table identifier value field (TID) that may identify a CAM entry as belonging to one or more particular data tables, a valid bit (V) which can include/exclude an entry from a search, and a entry value field that stores a value to be compared against a search key value KEY.

As shown in FIG. 12A, in such an approach, a first match can be found (yielding "INDEX1" as a search result). Such a matching entry can then be invalidated, by changing its valid bit from a valid state (in this case "1") to an invalid state (in this case "0") (FIG. 12B). A follow-on search can then be executed to look from another matching entry of lower priority (in this example, one yielding INDEXn as a search result) (FIG. 12C). In this way, a search may "invalidate" each new matching entry as it is found to thereby exclude it from further searches.

While such an approach can eventually determine all matching entries of a data set, such a conventional method may not be practical in systems where multiple threads of execution are sharing a CAM device. That is, after a search according to a first thread is executed according to one key, a subsequent search may represent a second thread, and thus utilize a different search key. In such a case, an "invalidated" matching entry would be erroneously excluded from the second thread search. Because packet processors can employ multiple threads/contexts, conventional approaches like that of FIGS. 12A to 12C are not a practical solution to such applications.

Another conventional technique is shown FIGS. 13A and 13B. FIGS. 13A and 13B show an arrangement in which table entries (e.g., CAM entries) can be connected to specialized hardware that can enable the "exploring" of portions of tables. Such hardware is referred to herein as "search-beyond" (SB) hardware. In such arrangements, an initial search can be executed with all desired entries available for search. If a match is found at location 'j' (FIG. 13A), a subsequent search can be executed with appropriate signals being applied to only search "beyond" location "j" (e.g., search addresses j+1 and up) (FIG. 13B).

A drawback to such arrangements is that considerable hardware may have to be added to a conventional CAM device to implement such a feature, further adding to the already high component cost.

In light of the above, it would be desirable to arrive at some way of providing for multiple match extraction searches that does not suffer from the above noted drawbacks.

It would also be desirable if such a solution could utilize existing "off-the-shelf" components, and not rely on specialized circuits, such as "search-beyond" circuits.

BRIEF DESCRIPTION OF THE DRAWINGS

FIGS. 7A to 7E show one example of multiple match extraction according to an embodiment.

FIG. 8 is a method of storing entry values according to one embodiment of the present invention.

FIGS. 13A and 13B are block diagrams showing a conventional "search beyond" or "explore" approach to extracting multiple match results.

DETAILED DESCRIPTION

Various embodiments of the present invention will now be described in detail with reference to a number of drawings. The embodiments include systems and methods for searching a search key against a number of stored entries by dividing a search key into two or more portions. A first portion of the search key is compared to a first collection of entries storing first portions of the entry values. If a match is found in the first collection of entries, a second set of entries can be searched with a second portion of the search key, in a sequential fashion. Methods for storing entry values in such systems are also disclosed.

The disclosed methods and systems present a search engine arrangement designed to find a "highest priority match" that can readily accommodate searches for "a first k" matches (k is an integer greater than 1) or "all matches" (i.e., multiple match extraction).

Figure 1:
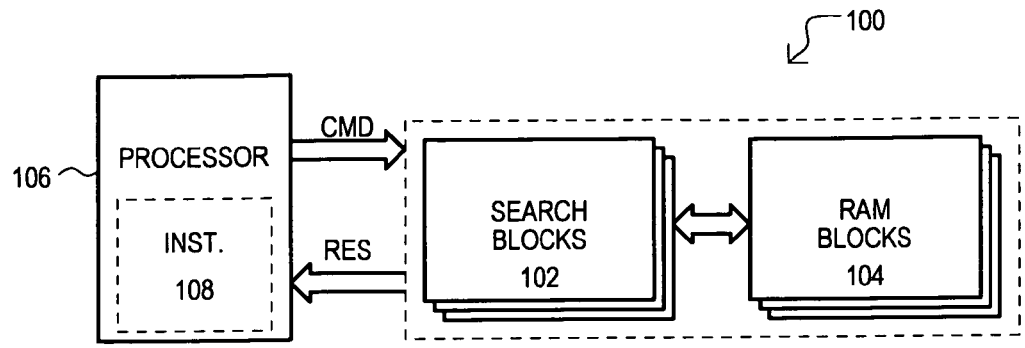
FIG. 1 is a block diagram of a search engine system according to a first embodiment of the present invention.

Referring now to FIG. 1, a search engine system is set forth in a block schematic diagram and designated by the general reference character 100. A search engine system 100 can include first blocks of entries 102 and second blocks of entries 104. Preferably, first blocks of entries 102 can be "search" blocks that can provide a relatively fast search speed of stored data value as compared to searches in the second blocks of entries 104. In one preferred arrangement, first blocks of entries 102 can be content addressable memory (CAM) entries, such as ternary CAM (TCAM) entries. As is well understood, CAM entries can be accessed essentially in parallel, allowing for rapid search results. Such CAM entries can optionally include global mask capabilities.

Preferably, second blocks of entries 104 can be randomly accessible entries that can be searched at a slower rate than first blocks of entries 102. In one preferred arrangement, second blocks of entries 104 can be random access memory (RAM) entries, such as static RAM entries. As is well understood, RAM entries can be accessed sequentially, according to predetermined addresses.

First blocks of entries 102 can be in communication with second blocks of entries 104. More particularly, and as will be described in more detail below, a matching result from first blocks of entries 102 can be used to access one or more locations in the second blocks of entries 104. Further, data values stored within both first and second blocks of entries (102 and 104) can be combined and output as a match result.

Optionally, a search engine system 100 can include a processor 106. A processor can include circuits for generating and issuing commands, as well as an instruction set 108 that may represent execution commands stored in a machine readable media. Commands (CMD) from processor 106 can be issued to first and/or second blocks of entries (102 and/or 104), and results (RES) generated can be received by processor 106.

Figure 2:
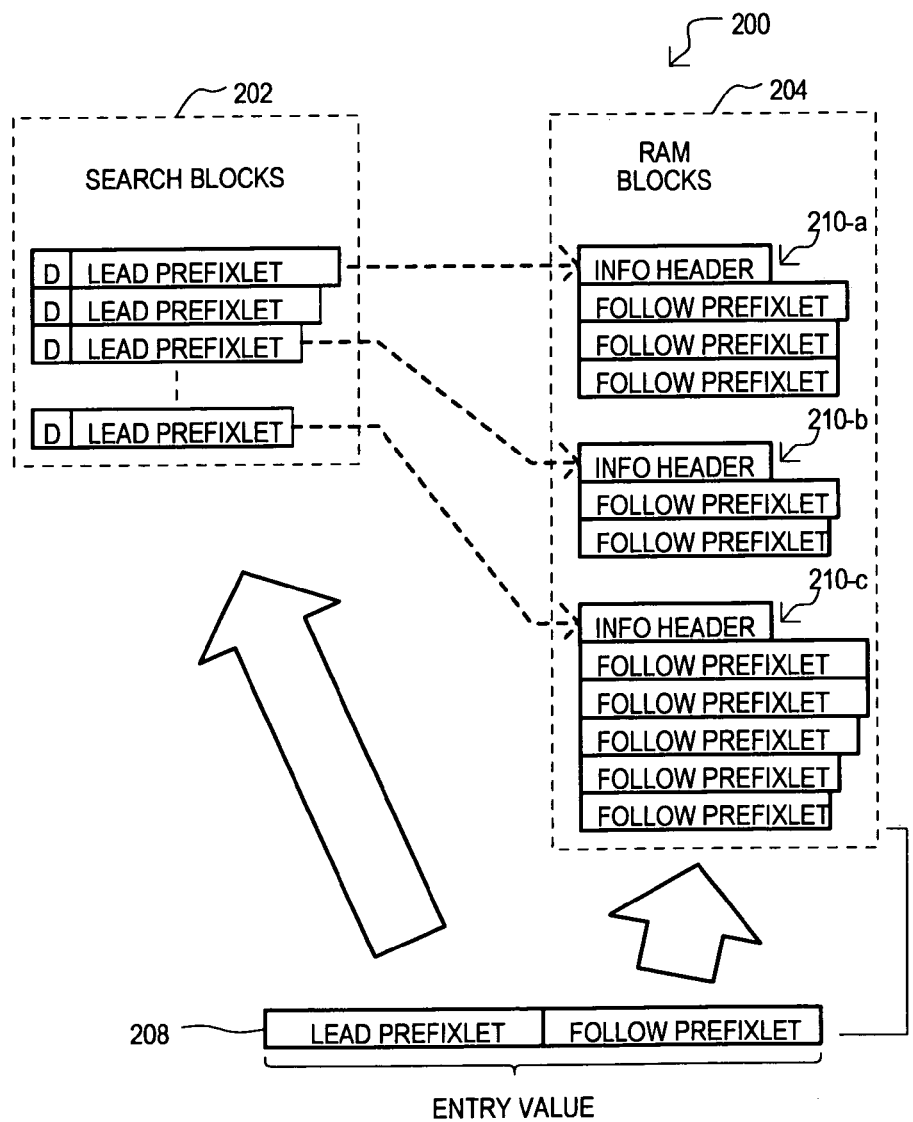
FIG. 2 is a block diagram showing entry values stored according to an embodiment of the present invention.

Having described the general arrangement of components of a search engine system, the arrangement of entry values within such a system will now be described with reference to FIG. 2. FIG. 2 is a logical representation of a search engine system 200 like that of FIG. 1. A search engine system 200 can include first blocks of entries 202 and second blocks of entries 204. Entry values, one of which is shown as 208, can be stored in the system 200 and searched against a search key value.

For storage within the system 200, each entry value can be logically divided into two or more portions, with one portion being stored in the first blocks 202 and another portion being stored in second blocks 204. In the particular example of FIG. 2, each entry is divided into a two portions: a "lead" prefixlet and a "follow" prefixlet. Lead prefixlets can be stored in first blocks 202, while follow prefixlets can be stored in second blocks 204.

Thus, it is understood that a system 200 can provide for a more compact database as one lead prefixlet can be shared by multiple follow prefixlets.

In FIG. 2, the entries of first blocks 202 can store lead prefixlets of entry values. Further, such entries can be logically connected to an associated search node (210-$a$ to 210-$c$) within second blocks 204. This logical connection is represented by dashed arrows in FIG. 2. In one very particular arrangement, such a logical connection can be the generation of RAM address within second blocks 204 according to an index value of the corresponding entry within first blocks 202. Such an address generation may be according to numerous well understood techniques, including but not limited to adding an offset to an index value or "hashing" an index value, to name but two of the many possible examples.

In the example of FIG. 2, entries within first blocks 202 can also include a "discriminator" values (D). Discriminator values are disclosed in copending U.S. patent application Ser. No. 10/866,353, filed on Jun. 11, 2004, titled METHOD FOR EXTRACTING MULTIPLE MATCHES FROM TERNARY CAM by Srinivasan Venkatachary. The contents of this application are incorporated by reference herein. As will be described in more detailed below, discriminator values can be utilized to selectively restrict a search space in a sequential series of searches.

Referring still to FIG. 2, the entries of second blocks 204 can store follow prefixlets of the entry values. Such follow prefixlets can be logically arranged into search nodes (210-$a$ to 210-$c$). Each search node can store one or more follow prefixlets corresponding to a corresponding lead prefixlet. In one particular arrangement, each search node (210-$a$ to 210-$c$) can include an information header (INFO HEADER) and one or more follow prefixlets. An INFO HEADER can include information related the corresponding follow prefixlets. As but one example, an INFO HEADER can store a value representing the size (W) of the corresponding lead prefixlet and the number of follow prefixlets (R) included within the search node. Even more particularly, an INFO HEADER can reside at one RAM address, and the corresponding follow prefixlets can be stored in the addresses immediately following the address of the INFO HEADER. However, such an arrangement represents one approach, and should not be construed as limiting to the invention.

Referring still to FIGS. 1 and 2, in one embodiment a search engine system 100 and/or 200 can be advantageously formed with "off-the-shelf" components. In particular, first blocks of entries (102 and 202) can be formed with one or more conventional CAM integrated circuit devices (e.g., TCAMs), and second blocks of entries (104 and 204) can be formed with one or more conventional RAM integrated circuit devices (e.g., SRAMs). In such an arrangement, a search operation can include a "fast" TCAM access that searches lead prefixlets essentially in parallel. In the event a lead prefixlet match results, any corresponding follow prefixlets can be searched by a sequence of read operation to the RAM entries corresponding to the matching CAM entry.

The above described approach may provide high performance at relatively low cost. The rapid search capabilities of a conventional CAM can provide a faster response than RAM based search engines, while at the same time, the offloading of follow prefixlets to RAM entries can reduce cost over a pure CAM solution. Further, this solution does not depend on any unique memory technology.

Still further, as will be described below, the inclusion of discriminator values in first blocks (102 and 202) can enable the extraction of multiple match results without the limitations of "entry-invalidation" approaches, like those described above in the BACKGROUND OF THE INVENTION. In particular, multi-threaded search operations can be executed on such a system.

While a system like that of FIGS. 1 and 2 can be implemented by separate CAM and RAM devices, it may be desirable to provide even faster performance by including both first blocks and second blocks in the same integrated circuit device. One such arrangement is shown in FIG. 3.

Figures 3, 4:
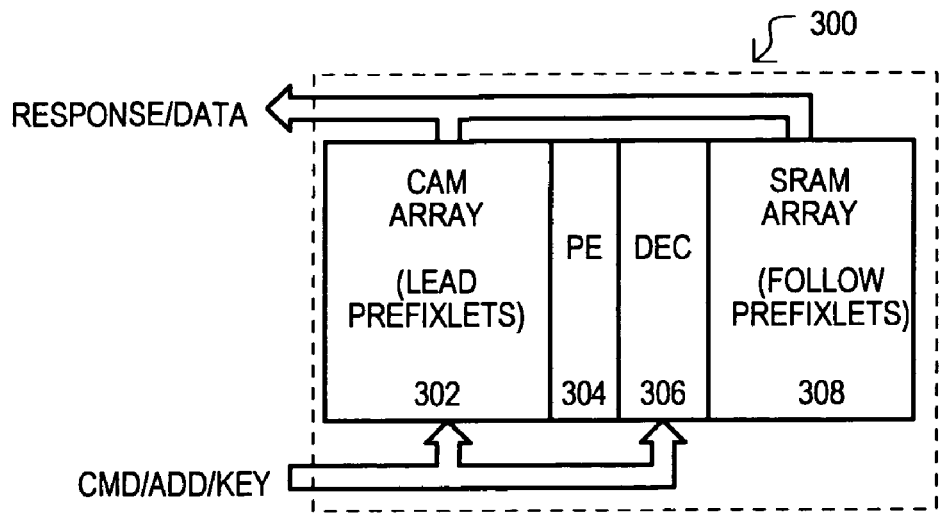
FIG. 3 is a block diagram of a search engine system according to another embodiment of the present invention.
FIG. 4 is a block diagram of a search engine system according to another embodiment of the present invention.

FIG. 3 is a block diagram of an integrated circuit device 300 that includes a CAM array 302, priority encoder 304, RAM decoder 306 and RAM array 308, all formed in the same integrated circuit substrate. A CAM array 302 can include a number of CAM entries that can store first entry portions (e.g., lead prefixlets). Match results from CAM array 302 can be indicated by priority encoder 304. Priority encoder 304 can generate a RAM address from a match result (e.g., generate a RAM address from the index of a matching CAM entry).

RAM addresses from priority encoder 304 can be received by RAM decoder 306, which can identify a particular search node within the entries of RAM array 308. Second entry portions (e.g., follow prefixlets) can be compared against corresponding search key portions. Entry value portions stored in both CAM array 302 and RAM array 308 can be combined to generate a single match result.

Forming CAM and RAM elements in the same integrated circuit device, may require customized circuitry. However, such an approach may provide improved performance over approaches utilizing standard CAM and RAM components.

It is understood that RAM entries in the various embodiments described above may preferably be formed from static RAM memory cells, for fast access times. However, the present invention should not necessarily be limited to such an arrangement. Alternate embodiments can include RAM blocks comprising dynamic RAM (DRAM) cells, or other memory cells including but not limited to EEPROM cells or more exotic RAM types (FRAM, MRAM, etc.).

It is also understood that search blocks formed from CAM cells can be formed from binary CAM cells, ternary CAM cells, and can incorporate global masking.

While the examples have described systems with entry values spread between CAM and RAM entries, alternate arrangements may be formed with only CAM entries. One such arrangement is shown in FIG. 4.

FIG. 4 is a block diagram showing an arrangement composed of only CAM entries. FIG. 4 shows TCAM entries 400 that are logically divided into a first section 402 that stores first portions of entry values (e.g., lead prefixlets) and a second section 404 that stores second portions of entry values (e.g., search nodes with follow prefixlets). In the particular arrangement shown, first sections and second sections can be distinguished according to a table identifier (TID) value. In addition, an address decoder 406 can provide random access to all CAM entries.

During a search operation, entries in the first section 402 can be accessed in parallel according to well-known CAM circuitry. In contrast, entries in a second portion 404 can be accessed in a random access fashion by address decoder 406.

An arrangement like that of FIG. 4 may provide flexibility in that a size of sections 402 and 404 can be adjusted as needed to accommodate a given set of entry values.

Having described various systems according to embodiments of the present invention, methods of searching and storing entry values will now be described.

A method according to the present invention is set forth below in pseudocode. Pseudocode is well known to those skilled in the art and provides a general representation of steps. Pseudocode methods can be represented by equivalent steps in particular computer languages (e.g., C), including hardware design languages (e.g., VHDL). One pseudocode embodiment is shown below:

(1) Issue Search key (K) with discriminator field set to 0.0. Load discriminator-set with X . . . X (all Xs). (X=don't care).
(2) Pop discriminator value D, from the discriminator-set.
(3) Search TCAM array with the GMR (global mask register), value D and obtain hit/miss. If hit result index=T, continue, else go to (8)
(4) Read the "Info Header" location corresponding to result index T. "Info Header" indicates width of matching TCAM entry at index T (W) and the number of RAM-Prefixlets, (R).
(5) Retrieve the "R" RAM-Prefixlets and match key K starting from the bit position (W+1) till the maximum length (or a value indicated in the "Info Header"). If there is at least one matching result $H_i$, go to (6), else go to (8).
(6) For all matching RAM-Prefixlet indices $H_i$, calculate matching result index T+$H_i$, and return the result indices in multiple cycles.
(7) Calculate new discriminator prefixes corresponding to the discriminator $D_i$, of the matching entry, T, and set the discriminator-set to these new discriminator prefixes.
(8) If discriminator-set is empty, STOP. Multi-match extraction for search Key K is over. Else go to (2)

In this way, searches of entry values can be split between rapidly searched first portions (stored in TCAM), and more economically stored second portions (stored in a RAM).

Figure 5:
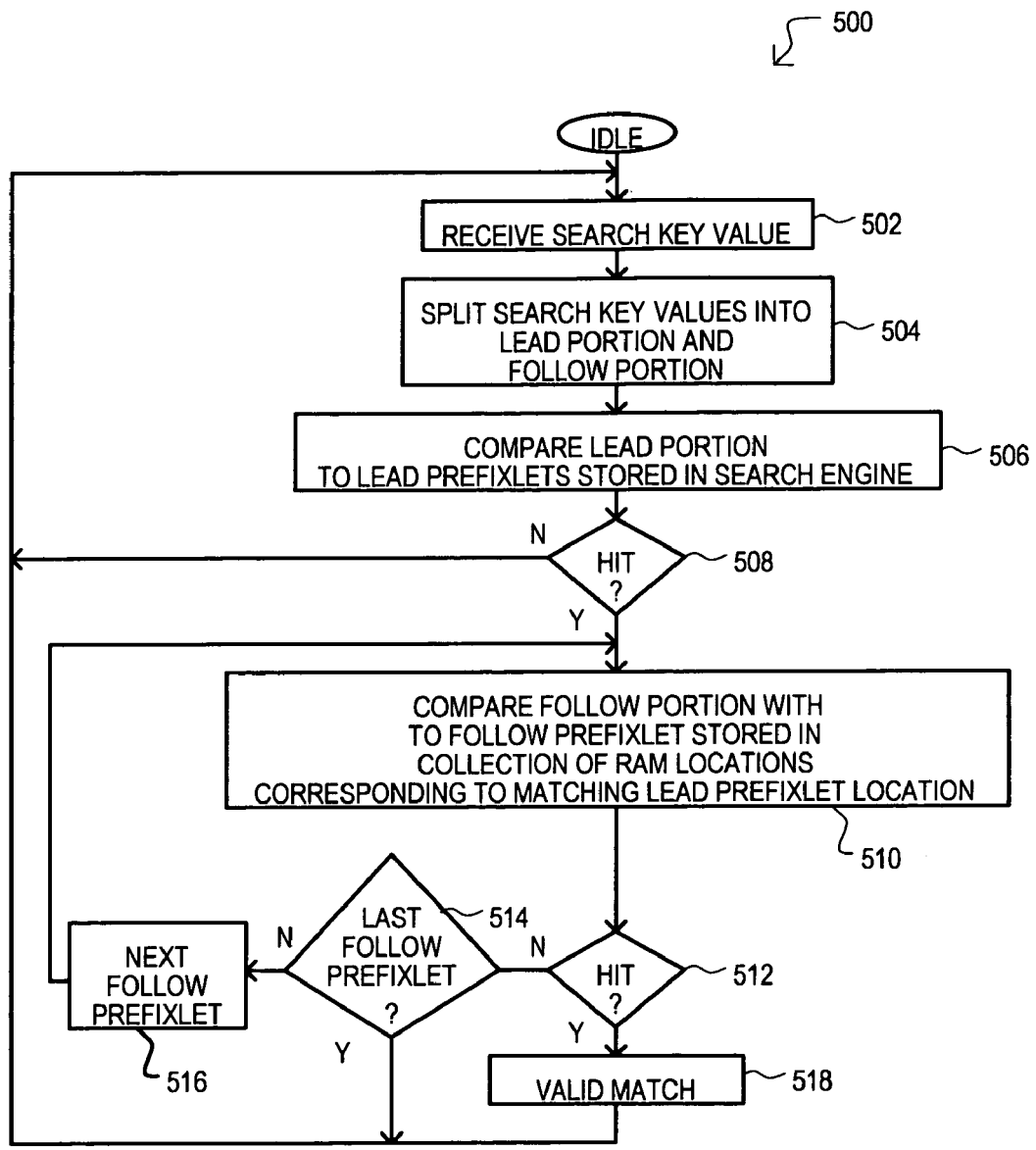
FIG. 5 is a flow diagram of a search method according to one embodiment.

Referring now to FIG. 5, a general method of searching according to one embodiment is shown in a flow diagram and designated by the general reference character 500. A method 500 can include receiving a search key value (step 502). Such search key value can be split into two or more portions. In the method of FIG. 5, a search key can be split into a lead portion and a follow portion (step 504). A lead portion can then be compared to lead prefixlets stored in a search engine (step 506). Preferably, a step 506 can include the essentially parallel comparison of a lead portion of a search value with corresponding lead prefixlets.

If a lead prefixlet does not match a lead portion of a search key value (N from 508), a search method can await the next search key value.

If a lead prefixlet does match a lead portion of a search key value (Y from 508), a follow portion can be compared to follow prefixes stored in locations corresponding to the matching lead prefixlet (step 510). Preferably, such a step can include reading a follow prefixlet from a RAM location, and comparing it to the follow portion of the search key, taking into account any global masking, if applicable. Such an operation can occur in a processor, or the like, and not utilize inherent matching capabilities of the storage cells themselves, as in the case of a CAM entry.

If the follow prefixlet does not match any of the follow portions included in the collection of RAM locations (N from 512), a search method can proceed and check any other follow prefixlets for match (steps 514 and 516). If the follow prefixlet matches a follow portion (Y from 512) a valid match has been determined. In one arrangement, the matching follow prefixlet can be matched with the corresponding lead prefixlet to generate a matching result.

Figure 6:
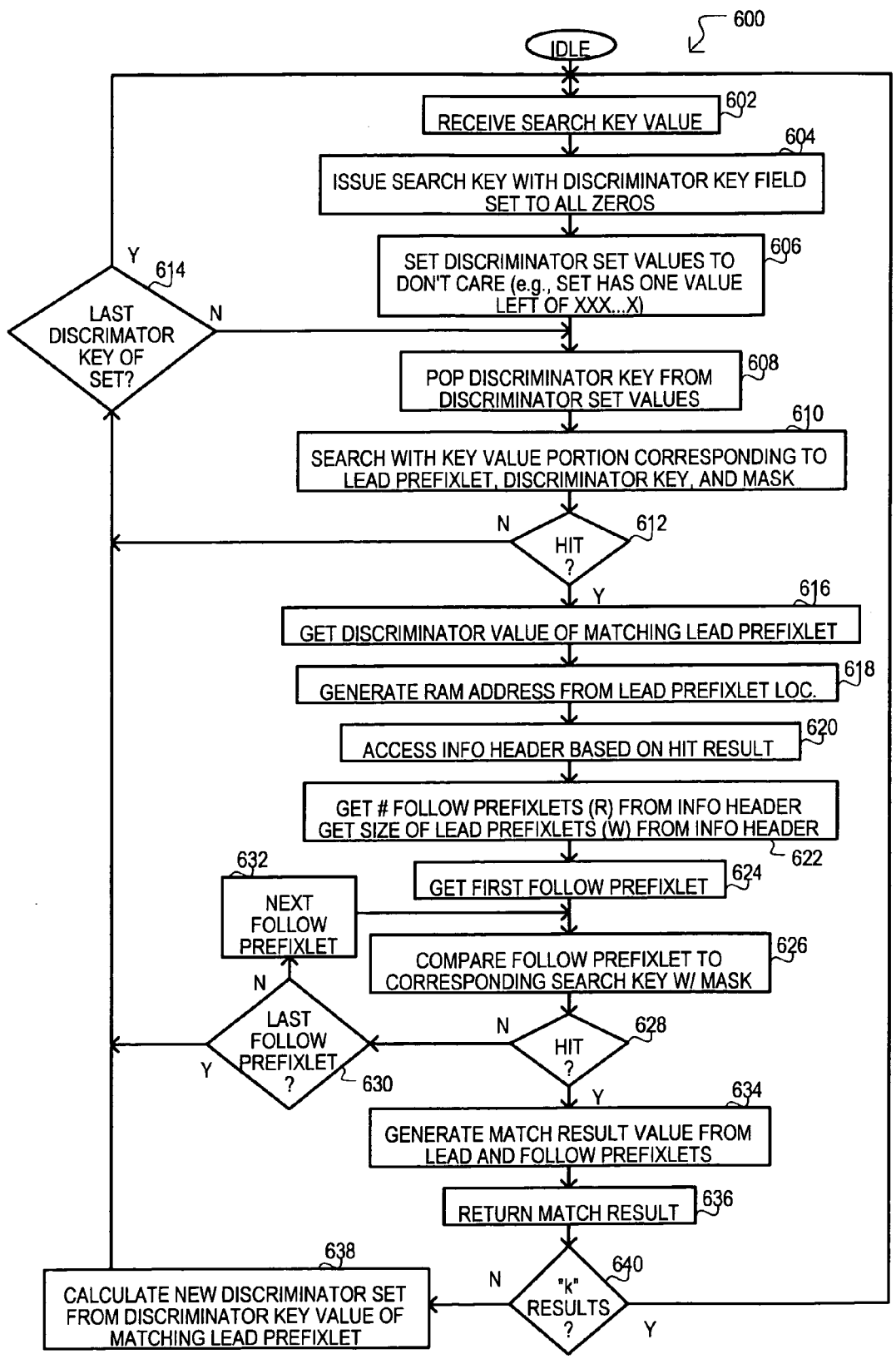
FIG. 6 is a flow diagram of a search method according to another embodiment.

Referring now to FIG. 6, a search method according to a second embodiment is shown in flow diagram and designate by the reference character 600. The method of FIG. 6 can include some of the same steps as that of FIG. 5. In addition, method 600 includes various steps related to applying a "discriminator" value. As noted above, a more detailed description of discriminator values is shown in copending U.S. patent application Ser. No. 10/866,353, filed on Jun. 11, 2004, titled METHOD FOR EXTRACTING MULTIPLE MATCHES FROM TERNARY CAM by Srinivasan Venkatachary. The contents of this application are incorporated by reference herein. Accordingly, FIG. 6 shows some discriminator value related steps.

More particularly, a method 600 can include issuing a search key with a discriminator value set to an initial value (step 606). In the example of FIG. 6, discriminator values can be all zeros. An initial discriminator key set of values can then be created (step 606). In the example shown, such an initial set can include a value that masks all discriminator values (e.g., all don't cares X's). This ensures an entire set of lead prefixlets will be accessed with an initial search.

An initial discriminator key value can be removed (e.g., popped) from the discriminator value (step 608). A search can then be executed using a portion (e.g., lead portion) of a search key in conjunction with the discriminator value (step 610). Of course, such a search can include global masking if such a feature is possible and/or desirable.

If a match does not result (N from 612), a discriminator key value set can be checked to see of the all discriminator key values have been used. If all discriminator key values have been used (Y from 614), the method 600 can await a next search key value. If all discriminator key values have not been used (N from 614), a method can search again with a new discriminator key value, on a new (i.e., smaller) set of lead prefixlets.

If a match results from a search with a lead portion of a search key value (Y from 612), a discriminator value from a lead prefixlet can be retrieved. In one arrangement, such an operation can include reading such a value from a CAM entry storing the lead prefixlet. A method can then continue to determine if a follow portion of a search key value matches the follow prefixlets associated with the matching lead prefixlet (steps 620 to 638). In the event a match result is found a new set of discriminator key values can be calculated (step 638), and searches can continue utilizing such a new set.

The example of FIG. 6 also allows for a limited extraction of "k" match results, as shown by step 640.

Figures 7A, 7B:
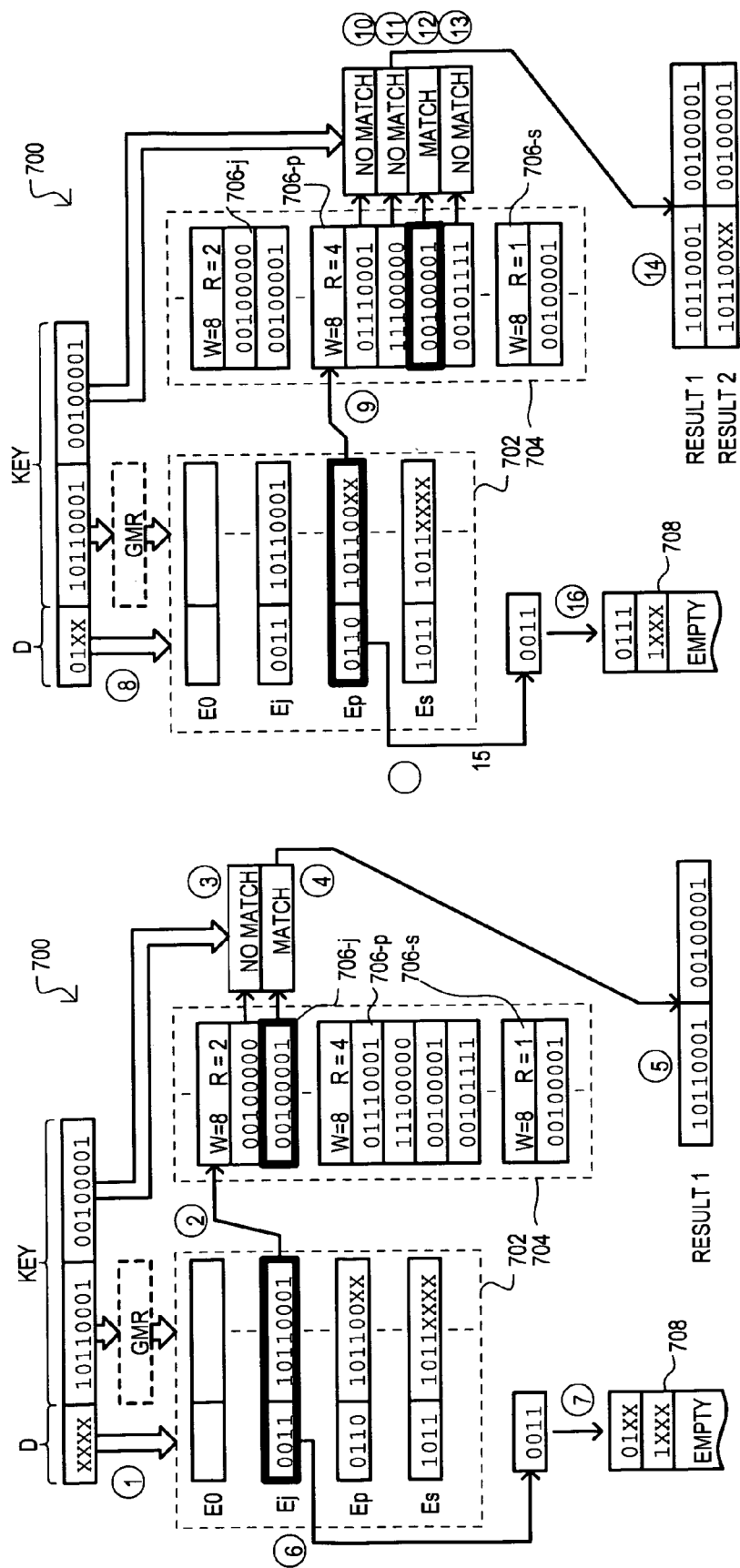

Having described a second method according to an embodiment of the present invention, one very particular example of multiple match extraction will be described with reference to FIGS. 7A to 7E. It is understood that FIG. 7A represents a simplified example, and other applications of the invention could include larger search key sizes with different sized lead and follow prefixlets, larger discriminator key values, different values and masking, to name but a few possible variations. The examples shows a series of numbered steps which are described below.

FIG. 7A shows the extraction of a first match result:

1) Lead portion of search key (KEY) with discriminator key value (D) searched against lead prefixlets stored in first entries 702.

2) Match occurs at entry Ej. Index of entry Ej utilized to generate address for search node 706-*j* of second entries 704.

3/4) Follow portion of search key (KEY) searched against follow prefixlets of accessed search node 706-*j*. Match occurs with last (second) follow prefixlet of search node.

5) Matching lead prefixlet and follow prefixlet used to create first match result (RESULT1).

6) Discriminator value of matching lead prefixlet accessed

7) New discriminator key set 708 generated from accessed discriminator value ("binary tree" method).

FIG. 7B shows the extraction of a second match result.

8) Lead portion of search key (KEY) with new discriminator key value (D) from set 708 searched against lead prefixlets stored in first entries 702.

9) Match occurs at entry Ep. Index of entry Ep utilized to generate address for search node 706-*p* of second entries 704.

10/11/12/13) Follow portion of search key (KEY) searched against follow prefixlets of accessed search node 706-*p*. Match occurs with third follow prefixlet of search node.

14) Matching lead prefixlet and follow prefixlet used to create second match result (RESULT2).

15) Discriminator value of matching lead prefixlet accessed

16) New discriminator key set 706 generated from accessed discriminator value ("binary tree" method).

Figure 7D:
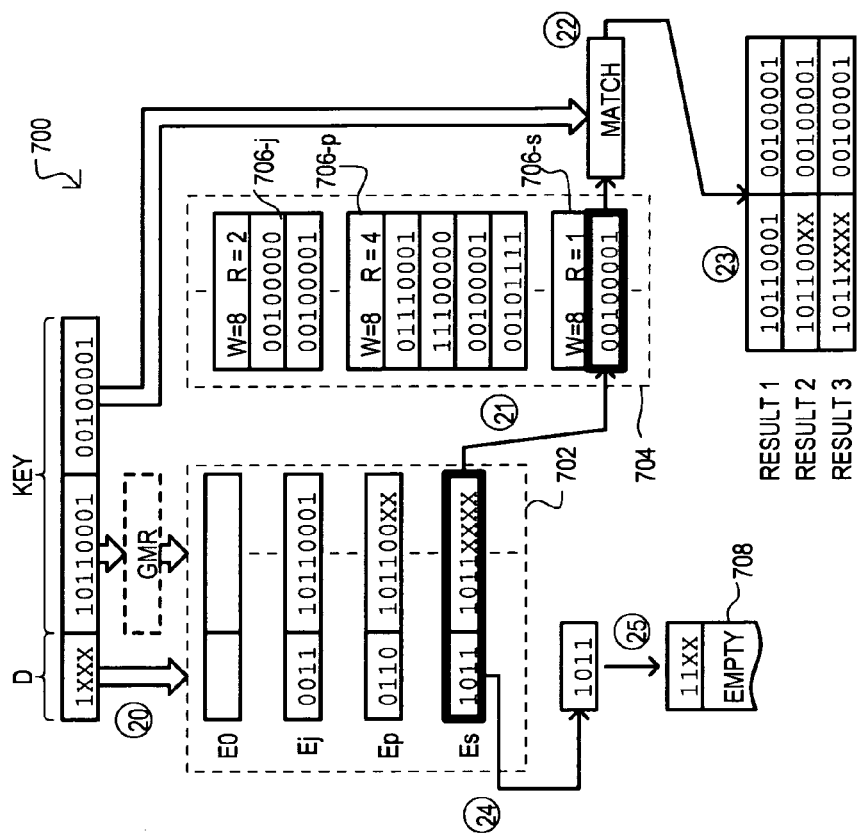
Figure 7C:
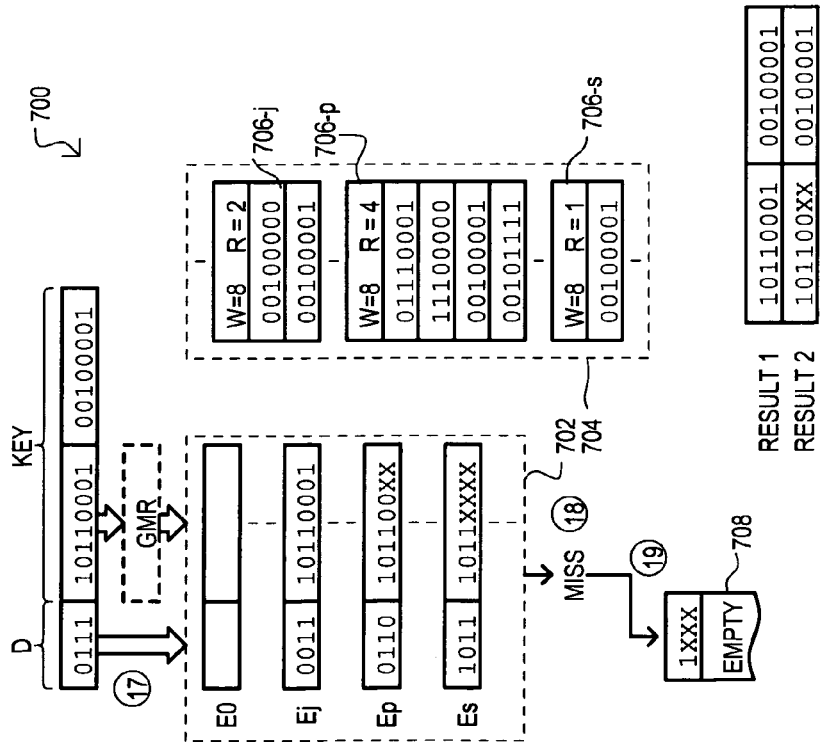

FIG. 7C shows a miss result.

17) Lead portion of search key (KEY) with new discriminator key value (D) from set 706 searched against lead prefixlets stored in first entries 702

18) No match occurs with any lead prefixlet.

19) Advance to next discriminator key value from set.

FIG. 7D shows the extraction of a last match result. The steps generally follow those of FIGS. 7A and 7B.

FIG. 7E shows a final miss result for the search key. The steps generally follow those of FIG. 7C. However, the discriminator key set 708 is now empty. As a result, the search is completed.

Again, FIGS. 7A to 7D represent but one particular example.

Referring now to FIG. 8, a general method of storing search key values in a system according to an embodiment of the present invention is shown in a flow diagram and designated by the general reference character 800. A method 800 can include receiving an entry value (step 802). Such an entry value can be split into two or more portions. In the example shown, an entry value can be split into a lead prefixlet and a follow prefixlet (step 804).

Each unique lead prefixlet can be stored in a separate first entry (step 806). Each unique follow prefixlet, having a same lead prefixlet, can be stored in a same group of RAM entries. Such a group of RAM entries can be accessed according to the corresponding lead prefixlet first entry (808).

In this way, entries can be efficiently stored for relatively fast search and high density. In addition, such an arrangement can have low cost in the event standard CAM/RAM devices are utilized.

Figure 9:
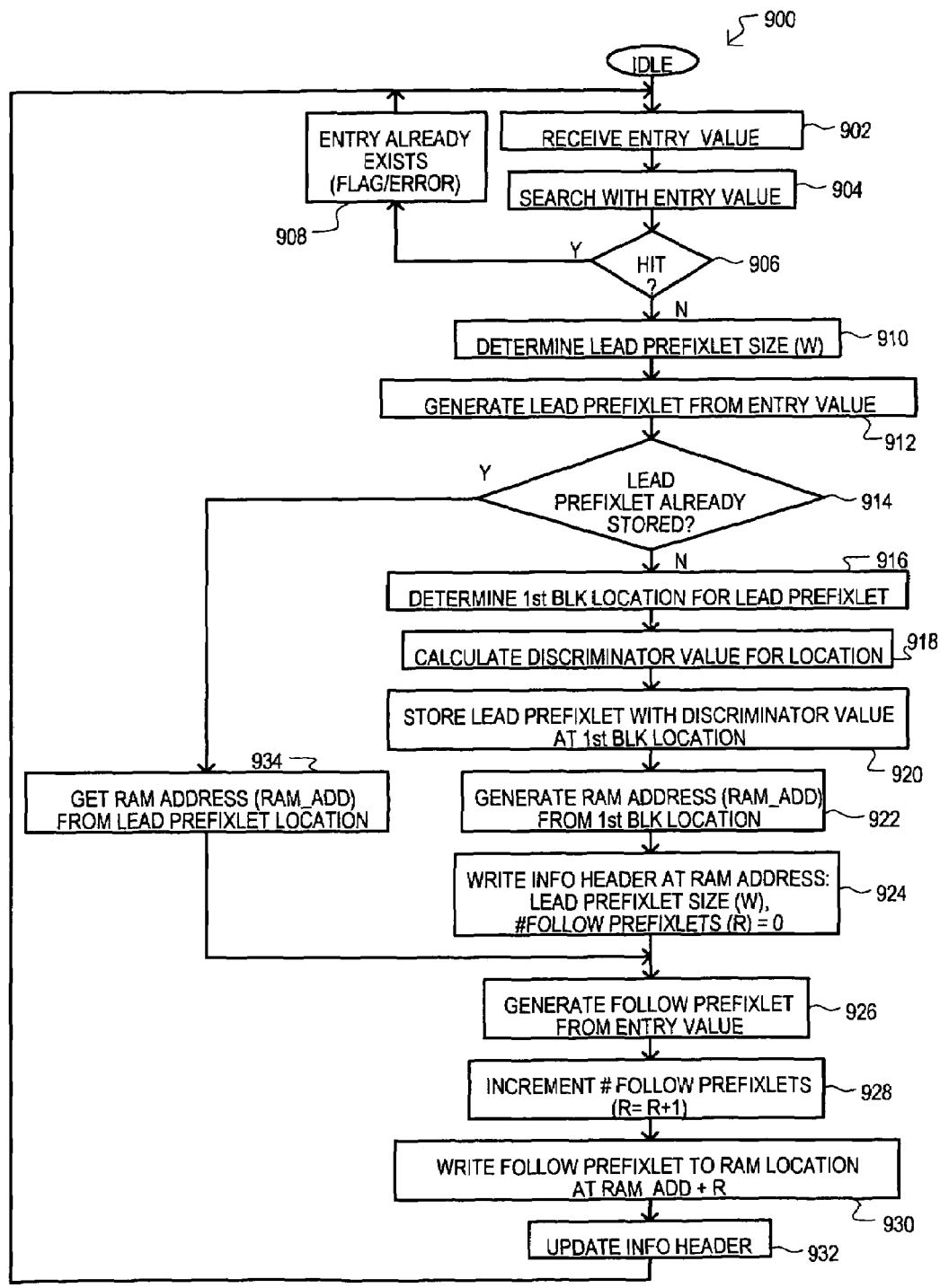
FIG. 9 is a method of storing entry values according to another embodiment of the present invention.

Referring now to FIG. 9, a method of storing entry values according to another second embodiment is shown in flow diagram and designate by the reference character 900. A method 900 can include some of the same general steps as that of FIG. 8. In addition, method 900 can include various steps related to providing a "discriminator" value for stored portions (e.g., lead prefixlets) of such entry values.

As noted above, a more detailed description of discriminator values is shown in copending U.S. patent application Ser. No. 10/866,353, filed on Jun. 11, 2004, titled METHOD FOR EXTRACTING MULTIPLE MATCHES FROM TERNARY CAM by Srinivasan Venkatachary. The contents of this application are incorporated by reference herein.

A method 900 shows first steps (902 to 908) in which an entry value can be searched to determine if it is already stored in the system.

If the entry value is not already stored in the system (N from 906), a lead prefixlet size (W) can be determined (step 910) and a lead prefixlet can be generated from the entry value (step 912).

A resulting lead prefixlet 914 can be checked to see if it is already stored (step 914). In one particular arrangement, such a step can include a conventional CAM search with the lead prefixlet against existing prefixlets stored in the CAM. If the lead prefixlet is not already stored (N from 914), an entry within a first block is created. In the particular example of FIG. 9, such an operation can include determining a first block location for the lead prefixlet (step 916). In one arrangement, such a step can be a "find next free address" operation. Of course, alternate methods could be used. Once a location has been determined, a discriminator value can be calculated (step 918). The lead prefixlet and corresponding discriminator value can then be stored at a first block location (step 920). In one very particular arrangement, such a step can include writing such values to a CAM address.

Having determined a first block location for a lead prefixlet, a method 900 can then begin creating a search node within a RAM. In the example of FIG. 9 this can include generating a RAM address for the search node from the first block location (step 922). Such a step can include adding an offset to an index value for the first block location or hashing such an index value, as but two of the many possible examples. An information header can then be created and written to such a location. In the example shown this can include writing, at least, a lead prefixlet size value (W) and setting a number of follow prefixlets (R) initially to zero (step 924).

A method can then write a follow prefixlet value to the search node. In FIG. 9 this includes generating a follow prefixlet value from the entry value (step 926). A number of follow prefixlets in the search node can then be incremented (step 928), and the follow prefixlet value can be written into a RAM location of the search node (step 930). In the example shown, follow prefixlets of the same search node are stored in sequential RAM locations following the information header. However, such a particular arrangement should not necessarily be construed as limiting to the invention. The header information can then be updated (i.e., to reflect new number of follow prefixlets) (step 932). This can include writing to the info header RAM location (e.g., read-modify-write).

Referring still to FIG. 9, if a lead prefixlet is already stored in a first block (Y from 914), a method can access the corresponding search node (step 934) and proceed to write the corresponding follow prefixlet and update the information header as described above.

Figure 10:
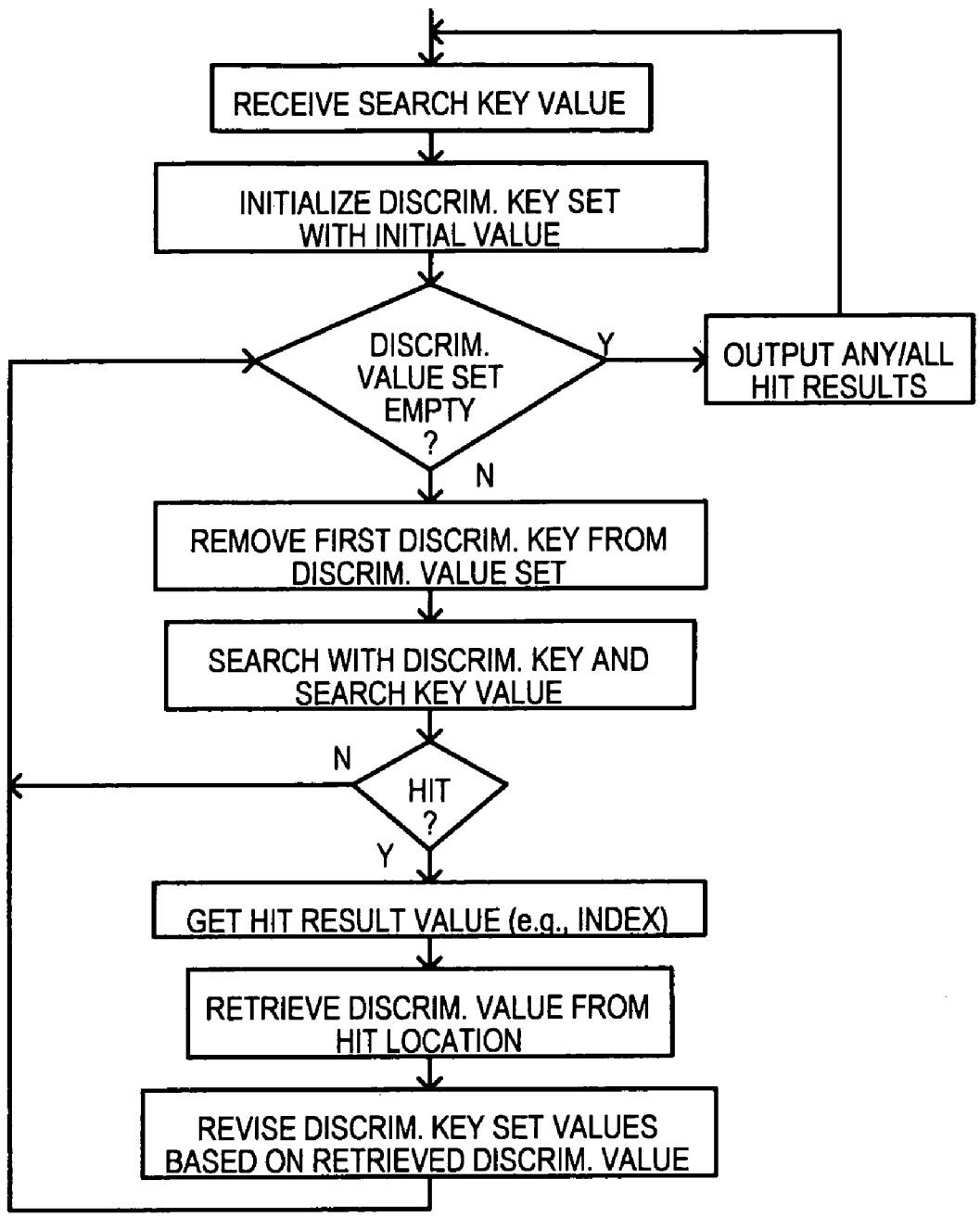
FIG. 10 is a flow diagram showing a method of searching with discriminator values.
Figure 11:
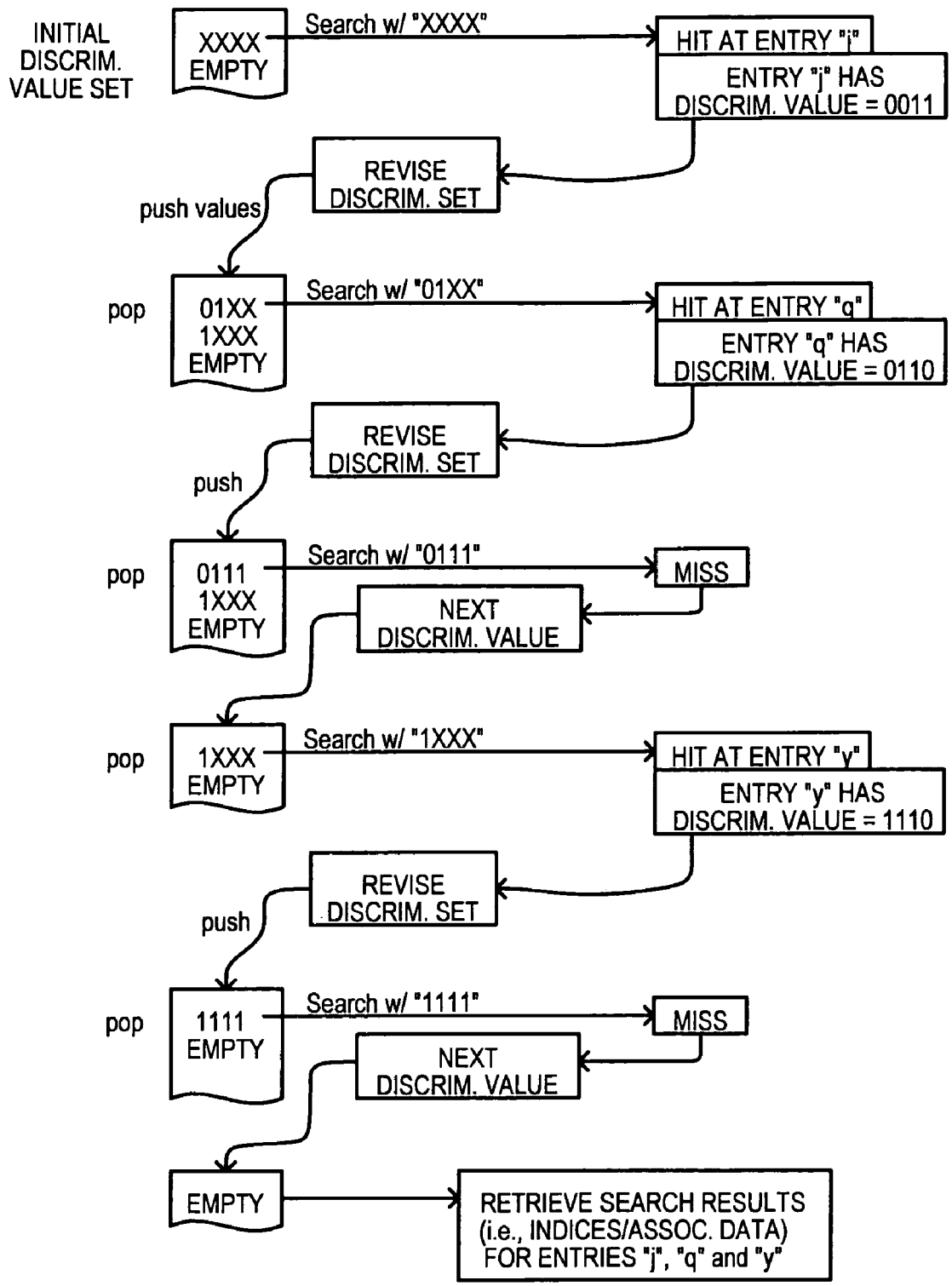
FIG. 11 is a diagram showing one example of searching with discriminator values.
Figure 12A:
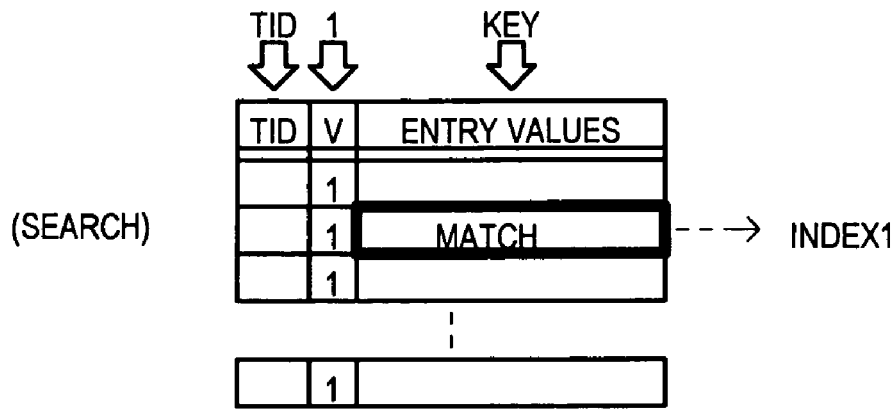
FIGS. 12A to 12C are block diagrams showing a conventional "invalidation" approach to extracting multiple match results.
Figure 12B:
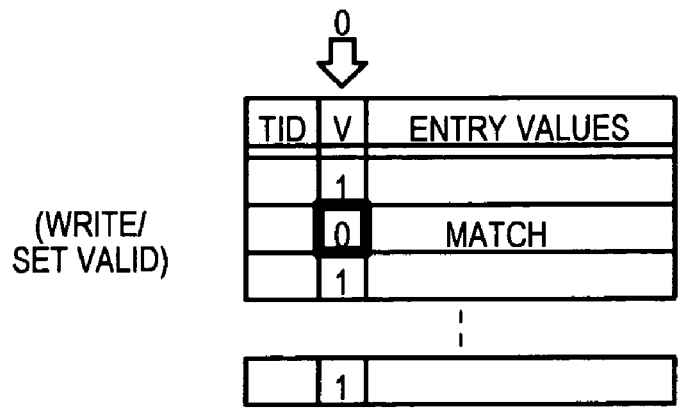
Figure 12C:
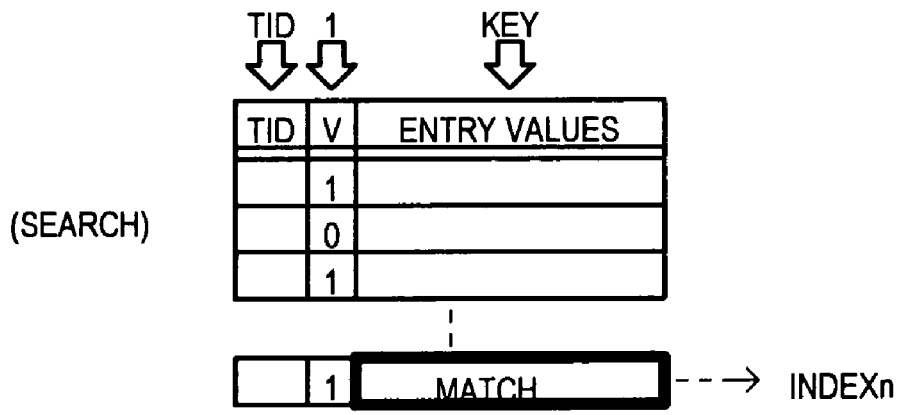

To assist in understanding the use of discriminator values in search operations, FIGS. 10 and 11 are provided. FIG. 10 shows a general search method in which discriminator key values are utilized to execute searches on increasingly smaller sets of entries by calculating values in a discriminator key table based on the discriminator value of a matching location.

FIG. 11 is a simplified diagram showing how a discriminator key set can be modified according to discriminator values from matching locations. FIG. 11 shows discriminator key sets being generated according to a binary tree method. However, this one approach should not be construed as limiting to the invention.

The various embodiments have demonstrated a novel scheme by which a first sets of entries (e.g., TCAM entries) that are designed to find the 'highest priority match' can be used to find "first k" (k>1) matches or "all matches". In particular approaches, a database of entry values can be segmented into two sections, such that one can be stored in a TCAM and another can be stored in an external memory. This may provide high performance than "RAM only approaches" but a lower cost than "CAM only approaches". Further, the arrangement does not necessarily have to utilize any specific memory technology.

The various approaches can keep information about every multi-match search not in the entry itself (e.g., by use of valid bit), but outside (retaining hit locations and discriminator values). Discriminator values in entries do not change per multi-match search. As a result, technique according to the present invention can works particularly well for multi-threaded systems by allowing different searches to be interspersed with one another. That is, multiple threads/contexts in a packet processor can search the database essentially simultaneously. Each thread can issue searches based on the result it obtained for a previous search, or predictively search portions of the database to speedup the operation.

It is understood that while CAM devices, such and TCAMs, can provide search results with deterministic latency with high performance parallel searches, the cost of TCAM-bit can be considerably higher than many RAM technologies like SRAM, SDRAM, RLDRAM, etc. In particular embodiments, performance vs. density can be proportioned by segmenting an entry value database into TCAM-Prefixlets (e.g., lead prefixlets) and RAM-Prefixlets (e.g., follow prefixlets) to get the maximum performance and optimal cost/bit. The right tradeoff between the TCAM and RAM costs can give a lower cost per entry than pure CAM solutions.

The various embodiments, can be advantageously compatible for a multi-threaded system and can scale well with number of threads when compared to conventional methods, like those described above. Presently, many multi-threaded packet processor can consists of 32-64 threads, and 128 threads is also common. Conventional approaches scale poorly with number of threads: supporting only up to 8 threads.

While the generation of discriminator values may be based on various features of a database, such a feature may be particularly advantageous in certain applications. In particular, for longest prefix match (LPM) applications, discriminator values can be based on the prefix length for a given lead prefixlet. However, in the case of an access control list (ACL) application, discriminator values can be based on the offset of an entry value within the ACL table.

For this reason, the various embodiments of the present invention can enjoy wide application in various industries. As but one example, the systems and methods according to the present invention can be included in packet processing hardware to provide rapid look-up capabilities without the undue component cost of systems utilizing only CAMs for the lookup operation.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A search engine system that stores a plurality of entry values for comparison with a search key value, comprising:
   a search section that includes a plurality of searchable entries, each searchable entry storing a first portion of at least one entry value and being logically linked to a corresponding search node group of randomly accessible entries; and
   a randomly accessible section that includes a plurality of randomly accessible entries arranged into search node groups, each search node group storing at least one second portion of an entry value having a first portion stored in the corresponding searchable entry.

2. The search engine system of claim 1, wherein:
   the searchable entries each comprise a plurality of content addressable memory (CAM) cells and are searchable in parallel with one another.

3. The search engine system of claim 2, wherein:
   the search section and randomly accessible section are formed in the same memory integrated circuit device.

4. The search engine system of claim 3, wherein:
   the search section comprises a first group of CAM entries formed in a CAM integrated circuit; and
   the randomly accessible section comprises a second group of CAM entries formed in the same CAM integrated circuit.

5. The search engine system of claim 1, wherein:
   the search section comprises a group of CAM entries formed in a CAM integrated circuit; and
   the randomly accessible section comprises a group of RAM entries formed in a different RAM integrated circuit.

6. The search engine system of claim 1, wherein:
   each searchable entry further includes a discriminator field that stores a discriminator value that is compared to a discriminator key that is different from the search key value, the discriminator values being unique to each searchable entry.

7. A method for comparing a search key to a plurality of entry values, comprising:
   comparing a first portion of a search key value to a plurality of corresponding first portions of the entry values;
   if the first portion of the search key matches one of the first portions of the entry values, accessing a corresponding search node group of randomly accessible memory locations that stores at least one second portion of an entry value of the corresponding first portion of the entry value; and
   sequentially comparing a second portion of the search key value to all second portion entry values stored in the accessed search node group.

8. The method of claim 7, wherein:
   comparing the first portion of a search key value to the plurality of corresponding first portions of the entry values includes a parallel comparison of the first portion of the search value to the first portions of the entry values.

9. The method of claim 7, further including:
   if a second portion of the search value matches a second portion of an entry value stored in a search node group, combining the second portion of the entry value with a matching first portion of an entry value to generate a match result.

10. The method of claim 7, further including:
    comparing a discriminator key value to discriminator values corresponding to each first portion of the entry values in addition to comparing the first portion of a search key value to the corresponding first portions of the entry values,
    the discriminator key value being different from the search key value, and
    the discriminator values corresponding to each first portion of a search key values logically arranging the first portions of the search key values into increasingly smaller searchable sets according to an applied discriminator key value.

11. The method of claim 10, wherein:
    in a first search with a search key value, masking the discriminator key value to match all discriminator values; and
    if a second portion of the search key value matches a second portion of an entry value stored in a search node group,
        generating a set of new discriminator key values based on the discriminator value corresponding to the matching first portion of an entry value, such new discriminator key value dividing the first portions of the entry values into smaller sized search sets, and
        searching with search key value and each discriminator value of the set.

12. The method of claim 7, wherein:
    the step of comparing the first portion of a search key value to a plurality of corresponding first portions of the entry values includes applying the search key value to a plurality content addressable memory (CAM) cell entries in parallel.

13. The method of claim 12, wherein:
    the step of accessing a corresponding search node group of randomly accessible memory locations includes
        generating a random access memory (RAM) address of a matching CAM cell entry, and
        reading header data info stored at the RAM address to determine the address of a second portion of a search key entry.

14. The method of claim 12, wherein:
    the step of sequentially comparing a second portion of the search key value includes
    (a) determining the number of second portions of search key values included in the search node group,
    (b) comparing a first of the second portions of search key values to the second portion of the search key, and
    (c) repeating step (b) until all second portions of the search key values of the search node group have been compared.

15. A method of storing entry values for comparison with a search key value, comprising the steps of:
    if the first portion of an entry value is not stored in a first collection of entries, storing the first portion of the entry value into an available entry of the first collection of entries, and storing a second portion of the entry value into a set of entries that is logically associated with the available entry of the first collection of entries, the set of entries being part of a second collection of entries different from the first collection of entries; and
    if the first portion of the entry value is stored in an existing entry of the first collection of entries, accessing an existing set of entries in the second collection of entries that is logically associated with the existing entry, and adding the second portion of the entry value to the existing set of entries if the second portion is not already stored in the existing set of entries.

16. The method of claim 15, further including:
storing the first portion of the entry value into the available entry includes storing the first portion of the entry into a content addressable memory (CAM) entry that is searchable in parallel with the entries of the first collection of entries.

17. The method of claim 15, further including:
each of the first collection of entries has a corresponding discriminator value that logically divides the first collection of entries into separately searchable subsections; and
if the first portion of the entry value is not stored in the first collection of entries, generating a discriminator value corresponding to the entry value into which the first portion of the entry value is stored.

18. The method of claim 15, wherein:
if the first portion of the entry value is not stored in the first collection of entries, generating a randomly accessible address corresponding to the logically associated set of entries in the second collection of entries.

19. The method of claim 15, wherein:
if the first portion of the entry value is not stored in the first collection of entries, creating an information entry in the logically associated set of entries that stores a size value corresponding to the size of the associated first portion of an entry and a number value corresponding to the number of second portions of an entry value stored in the associated set of entries.

20. The method of claim 15, further including:
if the first portion of the entry value is stored in an existing entry of the first collection of entries and if the second portion is not already stored in the existing set of entries, accessing the information entry of the existing set of entries in the second collection of entries and updating the number value once the second portion is added to the existing set of entries.

* * * * *